United States Patent
Trester

(10) Patent No.: US 10,115,676 B2
(45) Date of Patent: Oct. 30, 2018

(54) INTEGRATED CIRCUIT AND METHOD OF MAKING AN INTEGRATED CIRCUIT

(71) Applicant: NXP B.V., Eindhoven (NL)

(72) Inventor: Sven Trester, Goessendorf (AT)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/343,202

(22) Filed: Nov. 3, 2016

(65) Prior Publication Data

US 2017/0125357 A1 May 4, 2017

(30) Foreign Application Priority Data

Nov. 3, 2015 (EP) .................................. 15192766

(51) Int. Cl.
| | |
|---|---|
| *H01L 23/552* | (2006.01) |
| *H01L 23/528* | (2006.01) |
| *H01L 21/768* | (2006.01) |
| *H01L 23/52* | (2006.01) |
| *H01L 23/522* | (2006.01) |
| *H01L 23/00* | (2006.01) |
| *H01L 23/58* | (2006.01) |

(52) U.S. Cl.
CPC .......... *H01L 23/552* (2013.01); *H01L 21/768* (2013.01); *H01L 23/52* (2013.01); *H01L 23/522* (2013.01); *H01L 23/528* (2013.01); *H01L 23/5225* (2013.01); *H01L 23/5286* (2013.01); *H01L 23/573* (2013.01); *H01L 23/58* (2013.01); *H01L 23/585* (2013.01)

(58) Field of Classification Search
CPC ..... H01L 23/552; H01L 23/585; H01L 23/58; H01L 23/573; H01L 23/5286; H01L 23/522; H01L 23/52; H01L 23/5225; H01L 23/528; H01L 21/768
See application file for complete search history.

(56) References Cited

U.S. PATENT DOCUMENTS

2007/0121575 A1* 5/2007 Savry .................. G06K 19/073
370/351

FOREIGN PATENT DOCUMENTS

WO   WO-2005/117115 A1   12/2005

OTHER PUBLICATIONS

Extended European Search Report for Patent Appln. No. 15192766.2 (dated May 13, 2016).

* cited by examiner

*Primary Examiner* — Fernando L Toledo
*Assistant Examiner* — Adam S Bowen

(57) ABSTRACT

An integrated circuit and a method of making the same. The integrated circuit includes a semiconductor substrate. The integrated circuit also includes a metallization stack located on a major surface of the semiconductor substrate. The metallization stack includes a plurality of metal layers including patterned metal features. Each metal layer of the metallization stack is separated by an intervening dielectric layer. The metallization stack forms a first grid including patterned metal features for supplying power and signal connections to components of the integrated circuit located in the semiconductor substrate. The metallization stack also forms a second grid for securing the integrated circuit against electromagnetic attacks. The second grid includes patterned metal features interspersed with the patterned metal features of the first grid in at least some of the metal layers of the metallization stack. The patterned metal features of the second grid are electrically connected to the first grid.

15 Claims, 8 Drawing Sheets

INTEGRATED CIRCUIT AND METHOD OF MAKING AN INTEGRATED CIRCUIT

CROSS-REFERENCE TO RELATED APPLICATIONS

This application claims the priority under 35 U.S.C. § 119 of European patent application no. 15192766.2, filed on Nov. 3, 2015, the contents of which are incorporated by reference herein.

BACKGROUND

The present specification relates to an integrated circuit and to a method of making an integrated circuit.

Integrated circuits generally include a semiconductor substrate including active or passive components (transistors, diodes etc.), and a metallization stack provided on a major surface of the substrate. The metallization stack includes a plurality of patterned metal layers separated by intervening dielectric. The metal layers in the stack can be used to route, for instance, power supply lines, ground lines and signal lines within the integrated circuit.

Electromagnetic attacks against secure integrated circuits involve placing an induction loop over a surface of the integrated circuit to attempt to detect currents passing within the metal levels of the metallization stack.

SUMMARY

Aspects of the present disclosure are set out in the accompanying independent and dependent claims. Combinations of features from the dependent claims may be combined with features of the independent claims as appropriate and not merely as explicitly set out in the claims.

According to an aspect of the present disclosure, there is provided an integrated circuit comprising:
a semiconductor substrate; and
a metallization stack located on a major surface of the semiconductor substrate, the metallization stack comprising a plurality of metal layers including patterned metal features, wherein each metal layer of the metallization stack is separated by an intervening dielectric layer,
wherein the metallization stack forms a first grid including patterned metal features for supplying power and providing signal connections to components of the integrated circuit located in the semiconductor substrate, and
wherein the metallization stack also forms a second grid for securing the integrated circuit against electromagnetic attacks, wherein the second grid includes patterned metal features interspersed with the patterned metal features of the first grid in at least some of the metal layers of the metallization stack, and wherein the patterned metal features of the second grid are electrically connected to the first grid.

According to another aspect of the present disclosure, there is provided a method of making an integrated circuit, the method comprising:
providing a semiconductor substrate; and
forming a metallization stack located on a major surface of the semiconductor substrate, the metallization stack comprising a plurality of metal layers including patterned metal features, wherein each metal layer of the metallization stack is separated by an intervening dielectric layer,
wherein forming the metallization stack comprises:
forming a first grid including patterned metal features for supplying power and providing signal connections to components of the integrated circuit located in the semiconductor substrate; and
forming a second grid for securing the integrated circuit against electromagnetic attacks, wherein the second grid includes patterned metal features interspersed with the patterned metal features of the first grid in at least some of the metal layers of the metallization stack, and wherein the patterned metal features of the second grid are electrically connected to the first grid.

Embodiments of this disclosure may allow an integrated circuit to be secured against electromagnetic attacks (EMAs) involving, for instance, using a probe comprising an inductive loop to detect currents flowing within the metallization stack. In the first instance, it may be difficult to distinguish between features of the first grid and the second grid, so that the attacker cannot be sure as to the correct metal features to probe for detecting currents flowing within the first grid. Moreover, the electric fields associated with currents flowing within the patterned metal features of the second grid, which are connected to the first grid, may complicate detection of currents in the first grid using an induction loop. An attacker may not, for instance, be sure that a detected electric field may be attributed to current flow in a metal feature of the first grid and/or may not be sure that the detected electric field has not be distorted by current flow within the second grid.

The problems faced by an attacker, as described above, may be enhanced by the fact that the patterned metal features of the second grid are interspersed with those of the first grid, instead of being provided separately (e.g. in a metal layer overlaying the metal layers incorporating the features of the first grid). This may make it difficult or impossible to physically remove the second grid before conducting EMAs against the integrated circuit, and the proximity of the patterned metal features of the first and second grids may make it particularly difficult to distinguish between them or between the electric fields associated with current flowing within them.

The components of the integrated circuit located in the semiconductor substrate may for instance comprise active components (such as transistors or diodes) and/or passive components (such as resistors or capacitors).

At least some of the patterned metal features of the second grid may be electrically connected to patterned metal features of the first grid that form power supply connections of the first grid. At least some of the patterned metal features of the second grid may be electrically connected to patterned metal features of the first grid that form ground connections of the first grid. Note that these approaches may be combined, whereby some of the patterned metal features of the second grid may be electrically connected to power supply connections of the first grid while others of the patterned metal features of the second grid may be electrically connected to ground connections of the first grid. Note that connection of the patterned metal features of the second grid to power supply connections or ground connections of the integrated circuit may also reduce the resistance of these connections by providing additional path(s) for current flow.

The patterned metal features of the second grid may include a plurality of metal lines extending within at least some of the metal layers of the metallization stack.

The width of the metal lines of the second grid may be relatively small. For instance, a width of the metal lines of the second grid may be smaller than the a width of the patterned metal features of the first grid forming power supply or ground connections of the first grid.

In some examples, a width of the metal lines of the second grid may be substantially equal to a width of patterned metal features of the first grid forming signal connections of the first grid. In this way, it may be made difficult to distinguish between the metal lines of the second grid and the metal features of the first grid forming signal connections (which may also be metal lines). This may make attacks against the security of the integrated circuit more difficult.

In some examples, a width of the metal lines of the second grid may be substantially equal to a design rule minimum width for metal features of the metallization stack. By reducing the width of the metal lines of the second grid, the complexity and density of the layout of the second grid may be increased, making electromagnetic attacks against the security of the integrated circuit more difficult.

In some examples, the metal lines of the second grid may include metal lines extending in first and second orthogonal directions within the metallization stack. Again, this can increase the complexity of the layout of the second grid, making electromagnetic attacks against the security of the integrated circuit more difficult. Adjacent metal layers of the metallization stack may include metal lines extending in either the first or the second orthogonal direction, respectively. By alternating the direction of the metal lines of the second grid in successive layers of the metallization stack, capacitive and inductive coupling between the metal lines of the second grid in adjacent metal layers may be reduced.

Patterned metal features of the second grid located in different metal layers of the metallization stack may be interconnected by a plurality of metal filled vias.

A layout of the patterned metal features of the second grid may be irregular. For instance, the layout of the patterned metal features of the second grid may be non-repeating and may appear random (or pseudo-random).

In some examples, certain characteristics of the patterned metal features of the second grid, such as their width or spacing or whether they are connected to a power supply connection or to a ground connection, may be different at different locations of the metallization stack. In this way, the layout of the second grid may, for instance, be tailored to the local configuration of the first grid.

The method of making the integrated circuit may include a number of design steps. For instance, the method may include designing a layout of the first grid for supplying power and signal connections to components of the integrated circuit located in the semiconductor substrate, and then designing a layout of the second grid by identifying areas in the metallization stack not occupied by the patterned metal features of the first grid and locating the patterned metal features of the second grid in said areas. The method may further include forming the metallization stack according to the designed layouts of the first and second grids. It has been found that conventional integrated circuits typically may leave a considerable amount of free space within a metallization stack—this space may be utilised to accommodate the second grid of the present disclosure.

According to a further aspect of the present disclosure, there is provided a secure element including an integrated circuit of the kind described above. The secure element may, for instance, be provided in a credit card, health card, or a passport.

According to another aspect of the present disclosure, there is provided a mobile communications device including a secure element of the kind described above. The mobile communications device may, for instance, be a mobile telephone, tablet, watch, laptop or other device.

BRIEF DESCRIPTION OF THE DRAWINGS

Embodiments of this disclosure will be described hereinafter, by way of example only, with reference to the accompanying drawings in which like reference signs relate to like elements and in which.

DETAILED DESCRIPTION

Embodiments of this disclosure are described in the following with reference to the accompanying drawings.

Embodiments of this disclosure may provide an integrated circuit including a semiconductor substrate having a metallization stack located on a major surface thereof. As will be described in more detail below, the metallization stack may form first and second grids. The first grid may supply power and provide signal connections to components (e.g. active and/or passive components) of the integrated circuit located in the substrate, while the second grid may provide secure the integrated circuit against electromagnetic attacks.

The metallization stack may include a plurality of patterned metal layers deposited on the major surface of the semiconductor substrate. Each metal layer of the metallization stack may be separated from neighbouring layers in the metallization stack by an intervening dielectric layer. Each metal layer of the metallization stack may include patterned metal features, as will be described below. The technology used to form metallization stacks on semiconductor substrates is well established and will not be described herein in detail.

The various metal layers of a metallization stack according to an embodiment of this disclosure will be described herein below with reference to FIGS. 1 to 7.

Figure 1:
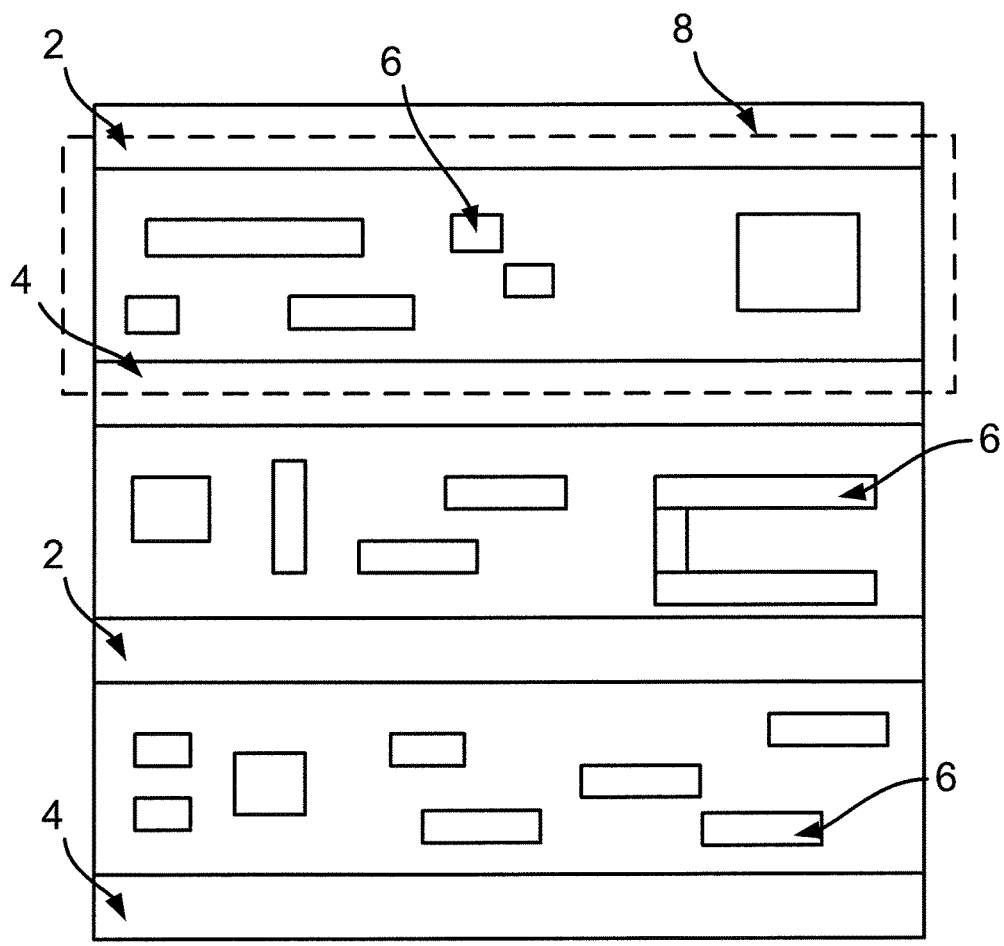
FIG. 1 shows a layout of a first metal layer in a metallization stack according to an embodiment of this disclosure.
Figure 2:
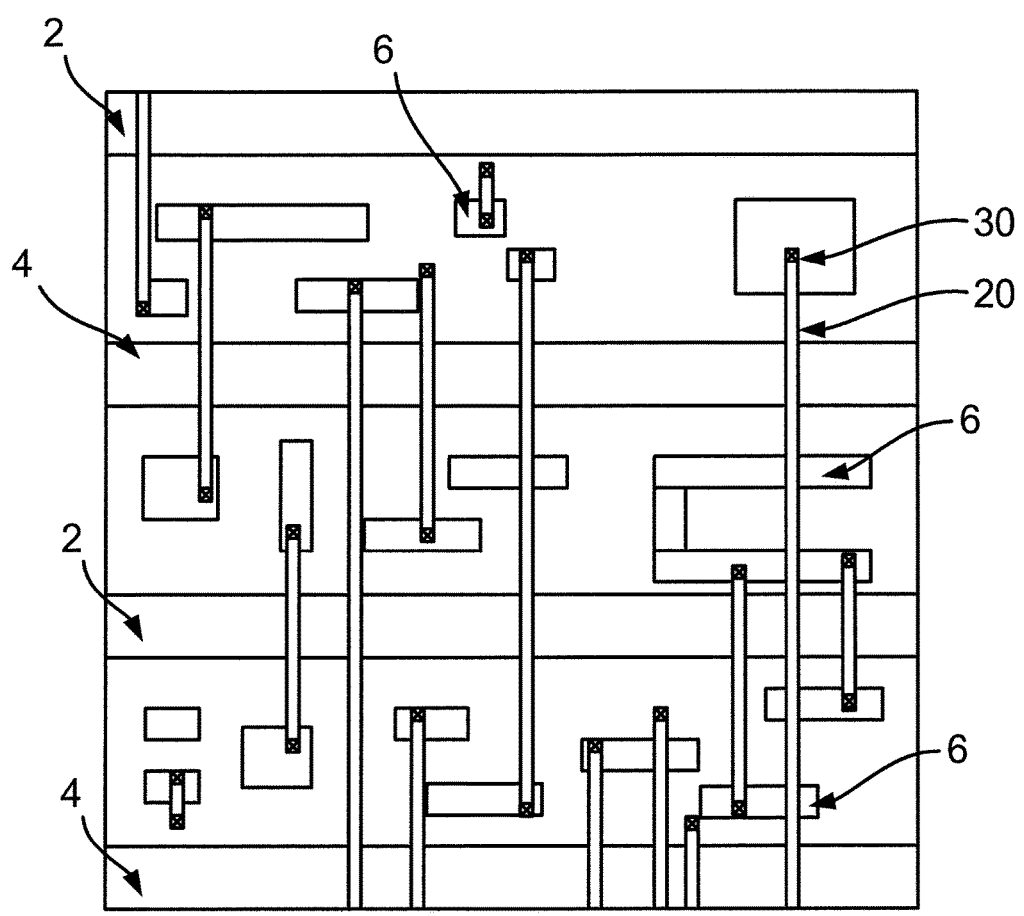
FIG. 2 shows a layout of a first and a second metal layer in a metallization stack according to an embodiment of this disclosure.
Figure 3:
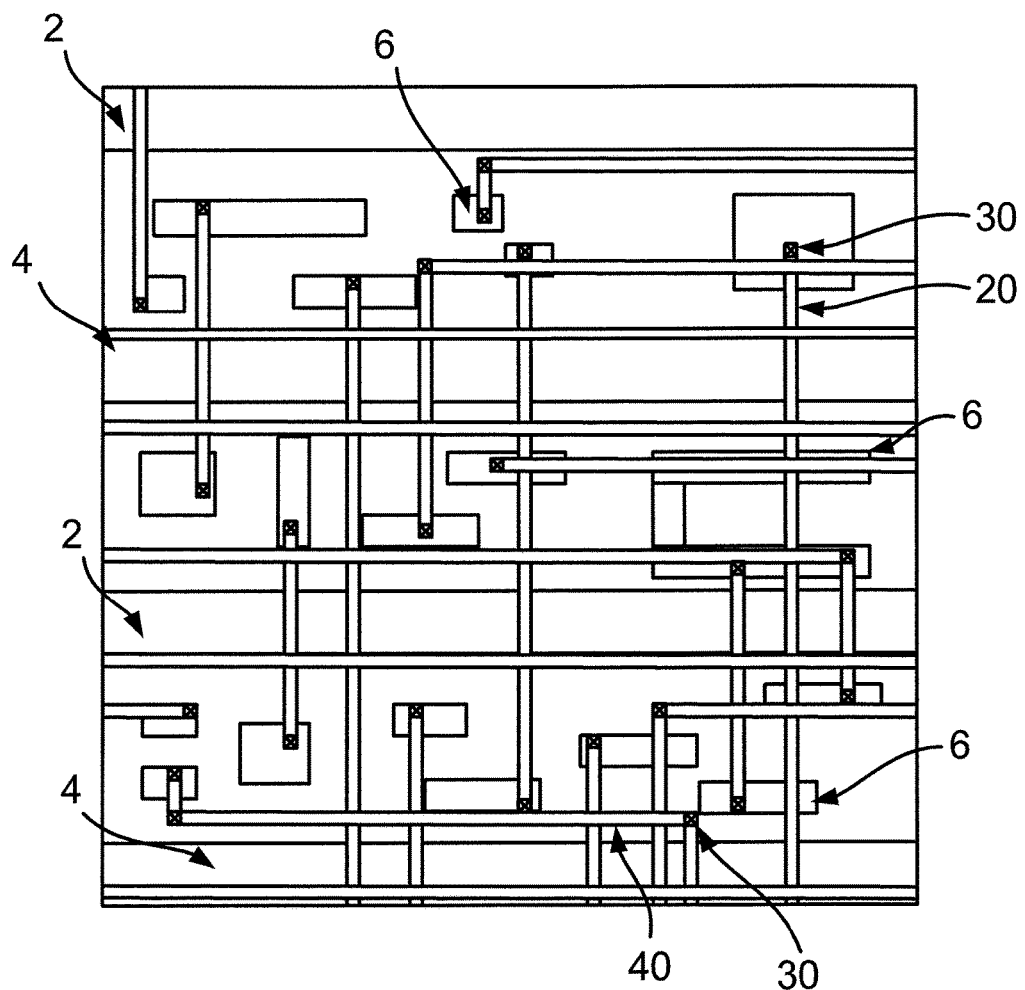
FIG. 3 shows a layout of a first, a second and a third metal layer in a metallization stack according to an embodiment of this disclosure.

FIGS. 1 to 3 show the patterned metal features of a first grid formed by a metallization stack in accordance with an embodiment of this disclosure. In this embodiment, the metallization stack includes a plurality of metal layers. FIG. 1 shows a lowest metal layer in the stack (this may also be referred to as "M1" or "Metal 1"). Metal layer M1 is the closest metal layer to the major surface of the semiconductor substrate upon which the metallization stack is provided.

FIG. 2 additionally shows a next metal layer in the metallization stack (this may also be referred to as "M2" or "Metal 2"). Metal layer M2 neighbors metal layer M1 and is located directly above metal layer M1 in the stack. FIG. 3 additionally shows a next metal layer in the metallization stack (this may also be referred to as "M3" or "Metal 3"). Metal layer M3 neighbors metal layer M2 and is located directly above metal layer M2 in the stack.

Hence, the features of metal layer M1 can be seen in FIG. 1, the features of metal layers M1 and M2 can be seen in FIG. 2, and the features of metal layers M1, M2 and M3 can be seen in FIG. 3. Further metal layers may be provided in the stack (e.g. metal layers M4, M5 . . . ), but for the purposes of brevity, only three metal layers are described in this example.

As is known in the art of semiconductor manufacturing, one or more passivation layers may be provided at the top of the stack. Openings may be formed in the passivation layer(s) for making electrical connections to the stack.

Metal filled vias may extend through the intervening dielectric layers of the metallization stack to interconnect the patterned metal features of the metal layers.

Each metal layer in the stack includes a plurality of patterned metal features. These metal features may include, for instance, islands and/or metal lines for forming electrical interconnections within the stack. As is known in the art, these patterned metal features can allow power to be distributed within the stack for powering active or passive components, such as transistors, diodes, resistors or capacitors located within the semiconductor substrate of the integrated circuit. The patterned metal features may also provide connections for distributing signals within the stack, for instance between the active or passive components of the integrated circuit. These power and signal connections may constitute a first grid formed by the metallization stack. As will be described later in relation to FIGS. 5 to 7, the metallization stack also forms a second grid.

In this example, metal layer M1 includes patterned metal features forming one or more power supply connections 2 and one or more ground connections 4. The power supply connection(s) 2 and ground connection(s) 4 may include patterned metal lines extending over the major surface of the semiconductor substrate, within metal layer M1. The power supply connection(s) 2 and/or ground connection(s) 4 may be connected to one or more pins of the integrated circuit, for connecting to an external power source, or may be connected to an IC internal power generator.

In the present example, all of the power supply and ground connections of the first grid of the metallization stack are provided in the first metal layer M1, although it is envisaged that power supply and/or ground connections of the first grid may be provided in other metal layer(s).

In this example, metal layer M1 also includes patterned metal features forming signal connections 6 within the stack. The signal connections 6 may, for instance be island shaped or may take the form of patterned metal lines extending over the major surface of the semiconductor substrate, within metal layer M1. As previously noted, the signal connections 6 may allow signals to be distributed within the stack. Since metal layer M1 is the lowest metal layer in the stack, at least some of the signal connections in metal layer M1 may connect directly with underlying components of integrated circuit within the substrate. Metal filled vias extending down to the substrate beneath the stack may be used to form these connections.

The metallization stack in this embodiment may include a plurality of standard cells. These standard cells, and the metal features that they contain, may be repeated at a plurality of locations within the stack. One such standard cell is illustrated by the dashed box labelled 8 in FIG. 1.

In this example, metal layer M2 includes a plurality of signal connections 20. These signal connections may take the form of metal lines extending over the major surface of the semiconductor substrate, within metal layer M2. In this example, the metal lines forming the signal connections 20 in metal layer M2 may all extend in a first direction within metal layer M2. However, it is envisaged that at least some of the metal lines forming the signal connections 20 in metal layer M2 may extend in a second direction within metal layer M2. The second direction may be substantially orthogonal to the first direction.

Metal filled vias 30 extending through the intervening dielectric layers of the metallization stack may interconnect the signal connections 20 of the metal layer M2 with the signal connections in other metal layers of the stack, such as metal layers M1 and/or M3. For instance, FIG. 2 shows a number of metal filled vias 30 connecting the signal connections 20 of metal layer M2 to the signal connections 6 of metal layer M1.

As can be seen from FIG. 3, metal layer M3 in this example also includes a plurality of signal connections 40. FIG. 3 also shows a number of metal filled vias 30 connecting the signal connections 40 of metal layer M3 to the signal connections 20 of metal layer M2.

The signal connections 40 may take the form of metal lines extending over the major surface of the semiconductor substrate, within metal layer M3. In this example, the metal lines forming the signal connections 40 in metal layer M3 may all extend in a second direction within metal layer M3. Hence, in this example, the signal connections 40 in metal layer M3 are all orthogonal to the signal connection 20 of metal layer M2. However, it is envisaged that at least some of the metal lines forming the signal connections 40 in metal layer M3 may extend in a different direction, such as the first direction mentioned above in relation to the signal connections 20 of the metal layer M2.

It is envisaged that at least some of the power connections and/or signal connections provided in the metal layers M1, M2, M3 may comprise metal lines having one or more turns or corners, such that different parts of the metal lines extend in different directions within the metal layer in which the metal lines are located.

Figure 4:
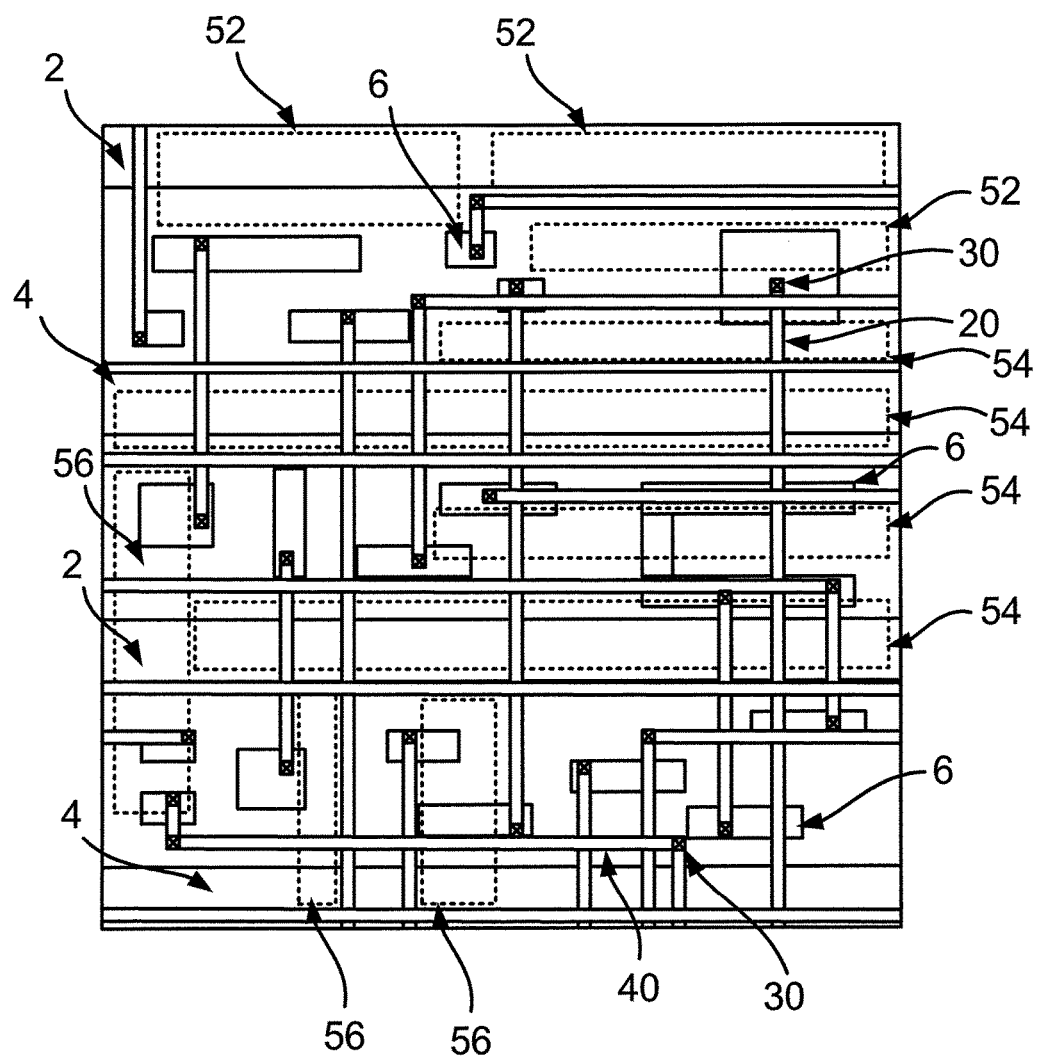
FIG. 4 shows a layout of a first, a second and a third metal layer in a metallization stack and illustrates the presence of a number of un-used areas in various layers of the stack according to an embodiment of this disclosure.

FIG. 4 shows that the patterned metal features of the first grid of the metallization stack described above have a layout that leaves a number of areas unoccupied. For instance, the areas 52 in FIG. 4 are unoccupied on both metal layers M2 and M3, while the areas 54 are unoccupied in metal layer M3 and the areas 56 are unoccupied in metal layer M2.

In accordance with an embodiment of this disclosure at least some of the areas not occupied by patterned metal features of the first grid may be occupied by patterned metal features of a second grid of the metallization stack.

Figure 5:
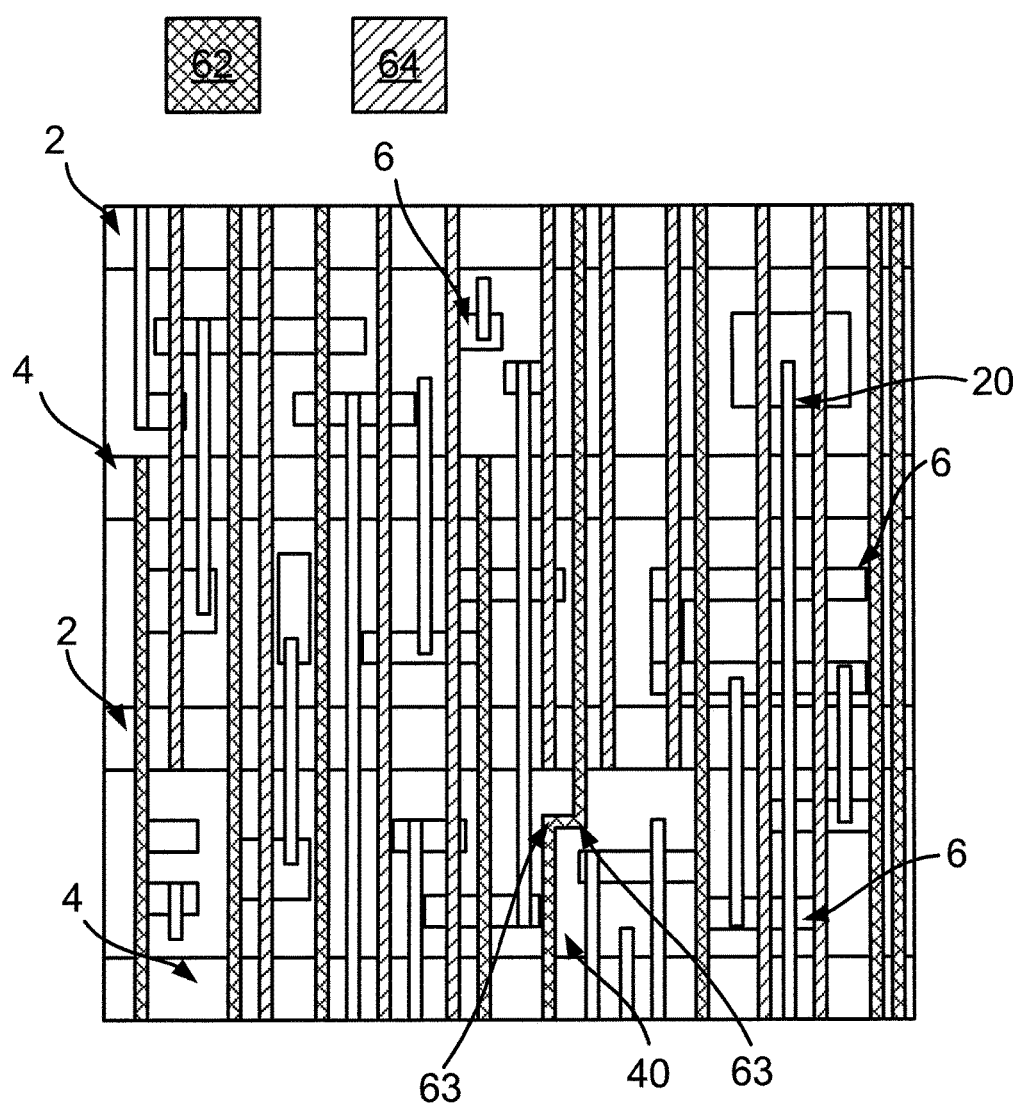
FIG. 5 shows a layout of a first and a second metal layer in a metallization stack according to an embodiment of this disclosure.
Figure 6:
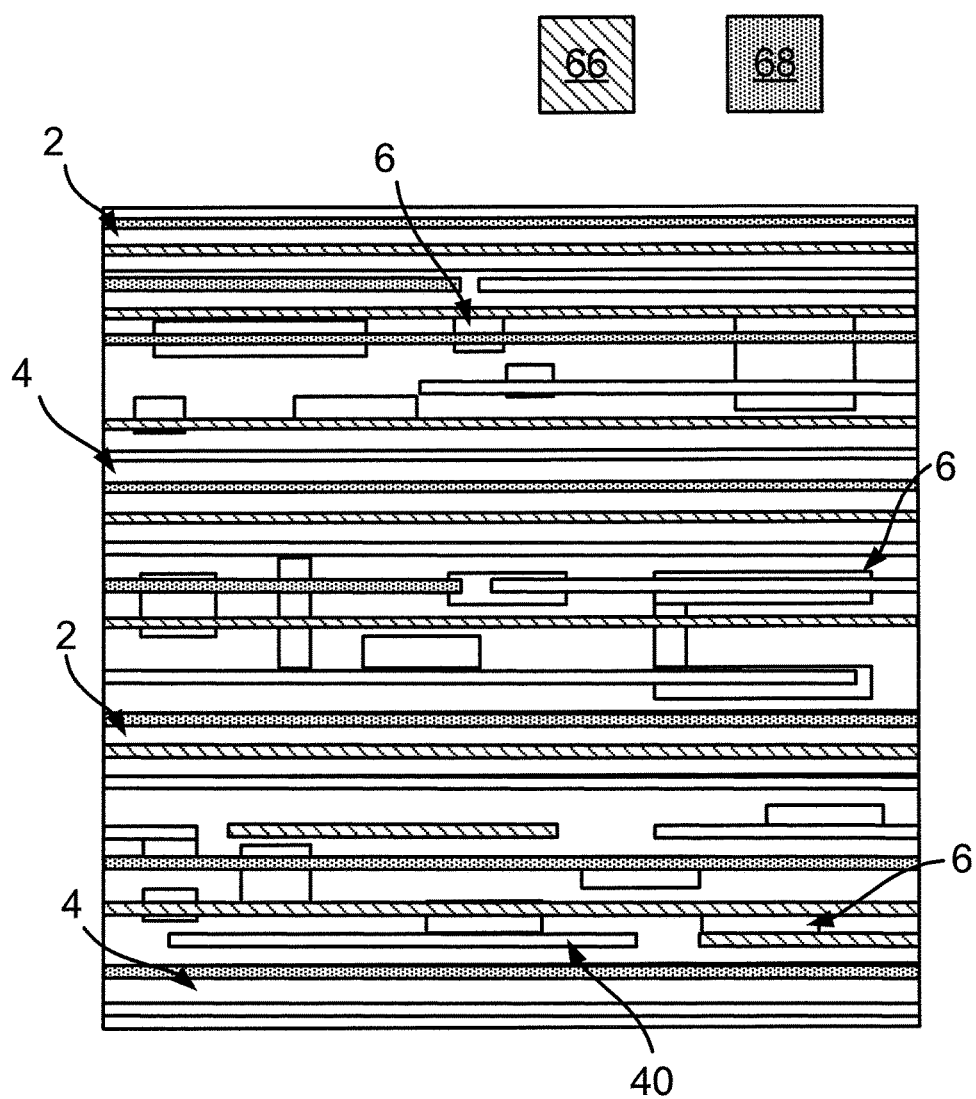
FIG. 6 shows a layout of a first and a third metal layer in a metallization stack according to an embodiment of this disclosure.
Figure 7:
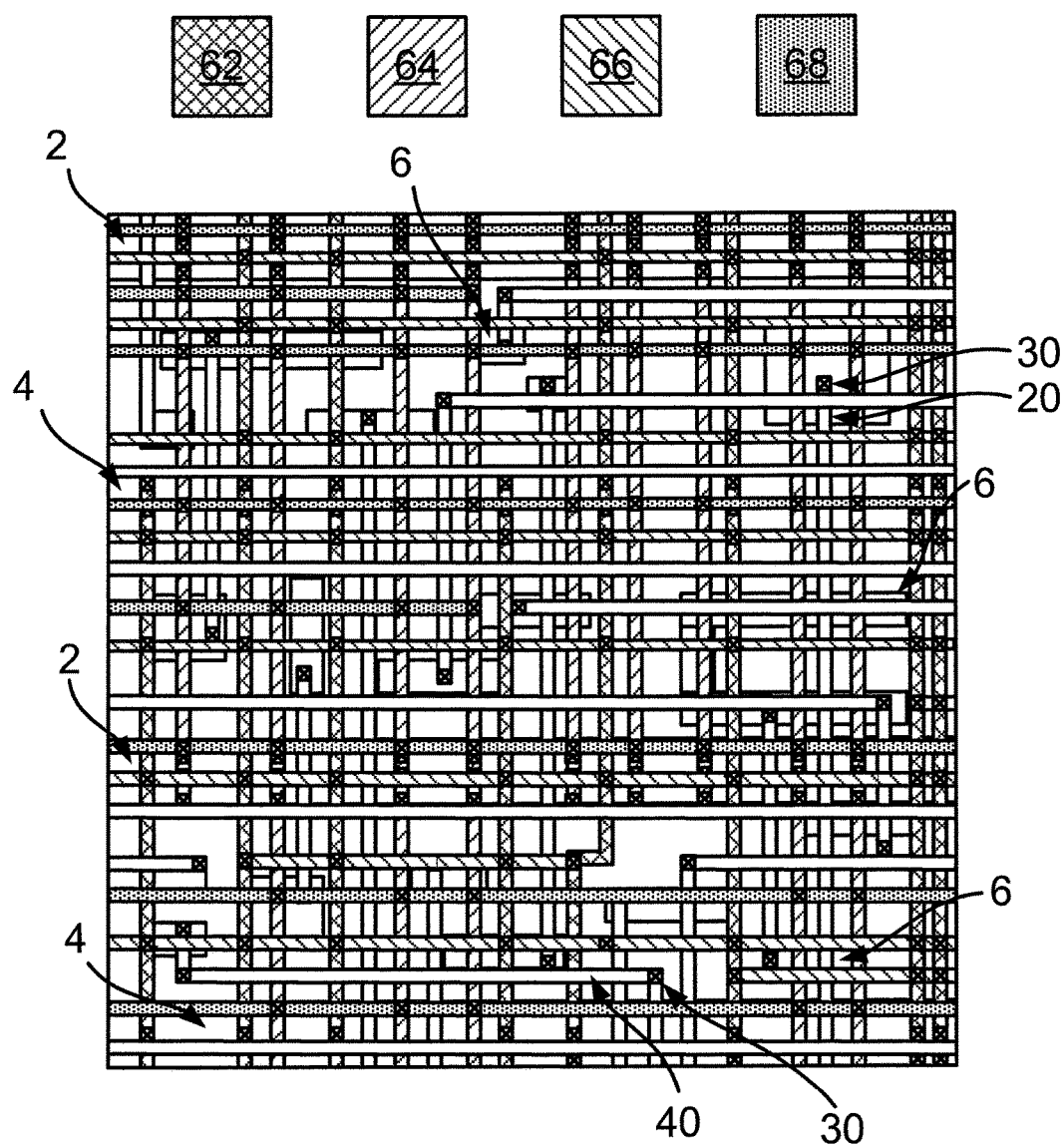
FIG. 7 shows a layout of a first, a second and a third metal layer in a metallization stack according to an embodiment of this disclosure.

FIGS. 5 to 7 show the patterned metal features of a second grid formed by the metallization stack described above in relation to FIGS. 1 to 4. The patterned metal features of the first grid are also shown in FIGS. 5 to 7, so that the locations of the patterned metal features of the second grid can be seen relative to the patterned metal features of the first grid.

The patterned metal features of the second grid may be provided in one or more metal layers of the metallization stack. In the present example, the patterned metal layers of the second grid are located only in metal layers M2 and M3.

It is envisaged that patterned metal layers of the second grid may also be located in other metal layers, such as metal layer M1.

As can be seen from the figures, the patterned metal features of the second grid may be interspersed with the patterned metal features of the first grid. As can also be seen from the figures, the patterned metal features of the second grid may occupy areas in the metallization stack not occupied by patterned metal features of the first grid.

As with the first grid, the patterned metal features of the second grid in each layer may be interconnected with the patterned metal features of the second grid in other metal layers (e.g. neighboring layers) using metal filled vias. For clarity, the vias used to interconnect the patterned metal features of the first and second grids are not shown in FIGS. 5 and 6, although they are included in FIG. 7.

FIG. 5 shows the patterned metal features of the first and second grids in metal layer M2, and also shows the patterned metal features of the first grid in metal layer M1. FIG. 6 shows the patterned metal features of the first and second grids in metal layer M3, and also shows the patterned metal features of the first grid in metal layer M1. FIG. 7 shows the patterned metal features of both grids in each of the metal layers M1, M2, M3.

The patterned metal features of the second grid may be electrically connected to the first grid. For instance, at least some the patterned metal features of the second grid may be electrically connected to patterned metal features of the first grid that form power supply connections of the first grid, and/or at least some the patterned metal features of the second grid may be electrically connected to patterned metal features of the first grid that form ground connections of the first grid.

As shown in FIG. 5, the second grid in this example includes patterned metal features 62 in the metal layer M2 that may be connected to ground connections of the first grid. FIG. 5 also shows that the second grid in this example includes patterned metal features 64 in the metal layer M2 that may be connected to power supply connections of the first grid. The connection of the patterned metal features 62, 64 of the second grid to the first grid may, for instance, be implemented by metal filled vias extending through the dielectric layer between metal layer M1 and metal layer M2 to connect the patterned metal features 62 to the ground connections 4 in the first metal layer and to connect the patterned metal features 64 to the power supply connections 2 in the first metal layer. In other examples, particularly where the power supply and ground connections of the first grid are located in other metal layers of the metallization stack, the connections between the second grid and the first grid may comprise metal filled vias extending between different metal layers of the stack.

As shown in FIG. 6, the second grid in this example includes patterned metal features 66 in the metal layer M3 that may be connected to ground connections of the first grid. FIG. 6 also shows that the second grid in this example includes patterned metal features 68 in the metal layer M3 that may be connected to power supply connections of the first grid. The connection of the patterned metal features 66, 68 of the second grid to the first grid may, for instance, be implemented by metal filled vias extending through the dielectric layer between metal layer M2 and metal layer M3 to connect the patterned metal features 66 to the patterned metal features 62 and to connect the patterned metal features 68 to the patterned metal features 64. Accordingly, at least some of the patterned metal features of the second grid may be electrically connected to the first grid through other patterned metal features of the second grid, which may be located in a different metal layer in the stack. It is also envisaged that direct connections may be made between the patterned metal features 66 and the ground connections 4 in the first metal layer M1 and between the patterned metal features 68 and the power supply connections 2 in the first metal layer M1.

The patterned metal features of the second grid may, for instance, be island shaped or may take the form of patterned metal lines extending over the major surface of the semiconductor substrate, within the metal layers.

In this example, most or all of the patterned metal features 62, 64 in metal layer M2 may extend in a first direction, which may be substantially the same direction as the direction in which the signal connections 20 in metal layer M2 extend. Similarly, most or all of the patterned metal features 66, 68 in metal layer M3 may extend in a second direction, which may be substantially the same direction as the direction in which the signal connections 40 in metal layer M3 extend. The first and second directions in which the patterned metal features 62, 64, 66, 68 extend may be substantially orthogonal.

In some examples, the direction in which most or all of the patterned metal features of the second grid extend may alternate in successive metal layers in the stack. For instance, in the present example, most or all of the patterned metal features 62, 64 in metal layer M2 extend in the first direction, while most or all of the patterned metal features 66, 68 in adjacent metal layer M3 extend in the second direction. In examples having further metal layers, this alternating arrangement may continue in those further metal layers (e.g. most or all of the patterned metal features in a metal layer M4 may extend in the first direction, most or all of the patterned metal features in a metal layer M5 may extend in the second direction, and so on). This alternating arrangement may allow capacitive and/or inductive coupling between the patterned metal features in different metal layers of the stack to be reduced.

In some examples, one or more of the patterned metal features forming the second grid may include one or more turns of corners. By way of example, one of the metal lines 62 shown in FIG. 5 includes two corners 63.

In accordance with embodiments of this disclosure, the dimensions of the patterned metal features of the second grid may be chosen to allow them to be accommodated in areas not occupied by patterned metal features of the first grid. The dimensions of the patterned metal features of the second grid may also be chosen to allow the density of the patterned metal features of the second grid to be relatively high, such that attempts to conduct electromagnetic attacks are made more difficult. Furthermore, the layout of the patterned metal features of the second grid may be chosen to be irregular (e.g. non-repetitive and/or apparently random), within the constraints imposed by the need to place the patterned metal features of the second grid in areas not occupied by the first grid. For instance, it is clear from inspection of FIG. 7 that the irregular and tangled appearance of the patterned metal features of the second grid, interspersed with the patterned metal features of the first grid, may make it particularly difficult to conduct electromagnetic attacks, since it may be difficult to distinguish the various patterned metal features as belonging to any particular grid of having any particular function, and since the relatively high density of the patterned metal features may inhibit attempts to detect currents using an induction loop.

In some examples, a width of the metal lines forming the patterned metal features of the second grid is smaller than the a width of the patterned metal features of the first grid forming power supply or ground connections of the first grid. For instance, with reference to FIGS. 5 and 6, it can be seen that the patterned metal features 62, 64, 66, 68 of the second grid are thinner than the thinnest dimension of any of the power supply connection(s) 2 or ground connection(s) 4 of the first grid.

Making the patterned metal features of the second grid relatively thin in this manner is counterintuitive since, as explained above, they may be connected to the power supply connection(s) 2 and/or ground connection(s) 4 of the first grid. Typically, metal features of a metallization stack that are required to pass current associated with power or ground connections are designed to have a minimum width that is relatively large. For instance, this minimum width may have been used to determine the minimum dimensions of the power supply connection(s) 2 and/or ground connection(s) 4 of the first grid. However, in accordance with embodiments of this disclosure, it has been realised that the relatively thin width of the metal lines of the second grid may not be problematic, since the second grid is provided in addition to the power supply connection(s) 2 and/or ground connection(s) 4 of the first grid. Accordingly, the patterned metal features of the first grid may provide an additional path for current flow within the stack, which may lower the resistance presented by the features of the metallization stack to such current flows, reducing loses.

In some examples, the dimensions of the patterned metal features of the second grid may be chosen to be substantially equal to a design rule minimum width for metal features of the metallization stack. Accordingly, the patterned metal features of the second grid may be made as thin as possible, within the constraints imposed by the metallization technology used to form the metallization stack.

In some examples, the dimensions of the patterned metal features of the second grid may be chosen to match the dimensions of the patterned metal features that form signal connections of the first grid. This may further confuse attempts to conduct electromagnetic attacks against the integrated circuit, since it may be difficult to distinguish between signal connections in the metallization stack and the patterned metal features of the second grid by inspection.

As described herein, the patterned metal features of the second grid, which are interspersed with the patterned metal features of the first grid may secure the integrated circuit against electromagnetic attacks such as those using a probe having an inductive loop to detect currents flowing within the metallization stack For instance, it may be difficult to distinguish between features of the first grid and the second grid, so that the attacker cannot be sure as to the correct metal features to probe for detecting currents flowing within the first grid. This problem faced by the attacker may be exacerbated by the irregular and/or tangled appearance of the patterned metal features in the stack. This problem may also be exacerbated where the patterned metal features of the second grid outwardly resemble the signal connections of the first grid (e.g. if they comprise metal lines having the same width).

Moreover, the electric fields associated with currents flowing within the patterned metal features of the second grid, which are connected to the first grid, may complicate detection of currents in the first grid using an induction loop. An attacker may not, for instance, be sure that a detected electric field may be attributed to current flow in a metal feature of the first grid and/or may not be sure that the detected electric field has not be distorted by current flow within the second grid. This problem may again be exacerbated by the relatively high density of the patterned metal features, which may be enabled by their relatively narrow widths. This problem may also again be exacerbated by the fact that the patterned metal features of the first and second grids may be interspersed.

An integrated circuit according to embodiments of this disclosure may provide a secure element. The secure element may provide a tamper resistant platform for securely hosting secure applications and their confidential and cryptographic data. A secure element of this kind may, for instance, be provided in a mobile communications device such as a mobile telephone, watch, tablet or laptop.

Figure 8:
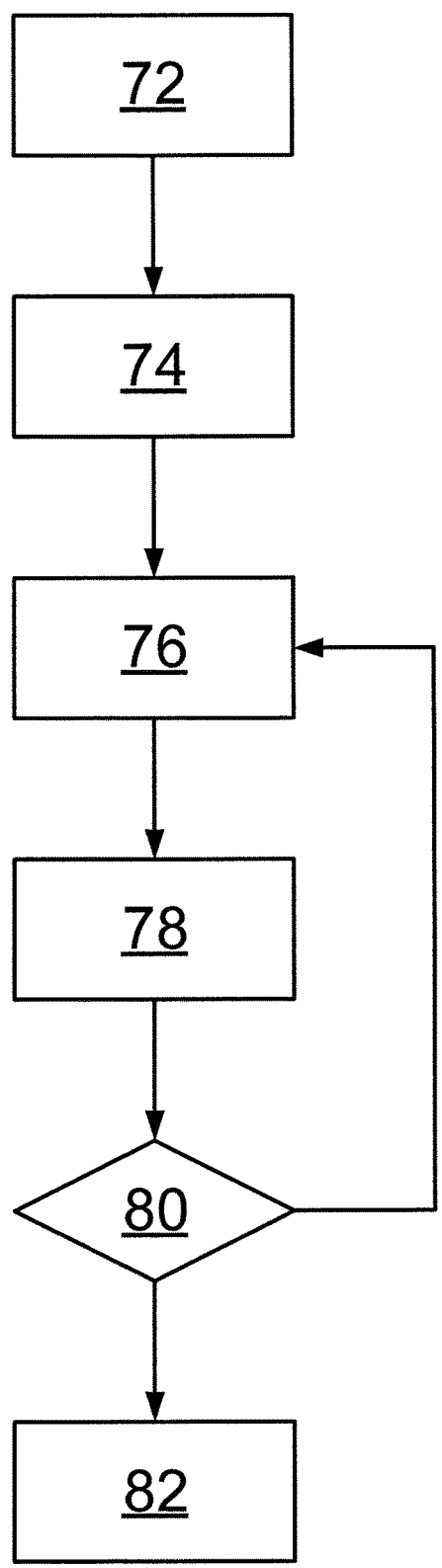
FIG. 8 shows a method according to an embodiment of this disclosure.

FIG. 8 illustrates a method of making an integrated circuit according to an embodiment of this disclosure.

In a first step 72, which may be referred to as a floor planning step, the layout of the features within the semiconductor substrate of the integrated circuit may be determined, such as placing IO cells and hard macro modules and determining the outlines for digital core areas.

In a next step 74, based on the knowledge of the layout determined in step 72, the layout of the power supply connection(s) and/or ground connection(s) of the first grid may be determined.

In a next step 76, based on the knowledge of the layout determined in step 74, the standard layout including all components and their signal connections of the first grid may be determined.

In a next step 78, based on the knowledge of the layouts determined in steps 74 and/or 76, the layout of the patterned metal features of the second grid may be determined. As noted previously, this may include identifying areas in the metallization stack that are not occupied by the patterned metal features of the first grid and locating the patterned metal features of the second grid in those areas.

In a next step 80, the layout of the metallization stack may be checked and approved. If the layout is not approved, then the method may return to step 76, to allow changes to be made to the patterned metal features of the first and second grids prior to re-checked.

If, in step 80, the layout of the metallization stack is approved, then the method may proceed to step 82, in which an integrated circuit may be manufactured having a metallization stack according to the design determined and checked in steps 72 to 80.

Step 82 may include providing a semiconductor substrate and forming the designed metallization stack located on a major surface of the semiconductor substrate. As previously described, the metallization stack may include a plurality of metal layers including patterned metal features, and each metal layer of the metallization stack may be separated by an intervening dielectric layer. Forming the metallization stack may include forming the first grid including patterned metal features for supplying power and providing signal connections to components of the integrated circuit located in the semiconductor substrate. Forming the metallization stack may also include forming the second grid for securing the integrated circuit against electromagnetic attacks. As previously noted, the second grid may include patterned metal features interspersed with the patterned metal features of the first grid in at least some of the metal layers of the metallization stack. The patterned metal features of the second grid may be electrically connected to the first grid.

Accordingly, there has been described an integrated circuit and a method of making the same. The integrated circuit includes a semiconductor substrate. The integrated circuit also includes a metallization stack located on a major surface of the semiconductor substrate. The metallization stack includes a plurality of metal layers including patterned metal features. Each metal layer of the metallization stack is separated by an intervening dielectric layer. The metallization stack forms a first grid including patterned metal features for supplying power and providing signal connections to components of the integrated circuit located in the semiconductor substrate. The metallization stack also forms a second grid for securing the integrated circuit against electromagnetic attacks. The second grid includes patterned metal features interspersed with the patterned metal features of the first grid in at least some of the metal layers of the metallization stack. The patterned metal features of the second grid are electrically connected to the first grid.

Although particular embodiments of this disclosure have been described, it will be appreciated that many modifications/additions and/or substitutions may be made within the scope of the claims.

The invention claimed is:

1. An integrated circuit comprising:
a semiconductor substrate; and
a metallization stack located on a major surface of the semiconductor substrate, the metallization stack comprising a plurality of metal layers including patterned metal features, wherein each metal layer of the metallization stack is separated by an intervening dielectric layer,
wherein the metallization stack forms a first grid including patterned metal features for supplying power and providing signal connections to components of the integrated circuit located in the semiconductor substrate, and
wherein the metallization stack also forms a second grid for securing the integrated circuit against electromagnetic attacks, wherein the second grid includes patterned metal features interspersed with the patterned metal features of the first grid in at least some of the metal layers of the metallization stack, and wherein the patterned metal features of the second grid are electrically connected to the first grid.

2. The integrated circuit of claim 1, wherein at least some of the patterned metal features of the second grid are electrically connected to patterned metal features of the first grid that form power supply connections of the first grid.

3. The integrated circuit of claim 1, wherein at least some of the patterned metal features of the second grid are electrically connected to patterned metal features of the first grid that form ground connections of the first grid.

4. The integrated circuit of claim 1, wherein the patterned metal features of the second grid comprise a plurality of metal lines extending within at least some of the metal layers of the metallization stack.

5. The integrated circuit of claim 4, wherein a width of the metal lines of the second grid is smaller than a width of the patterned metal features of the first grid forming power supply or ground connections of the first grid.

6. The integrated circuit of claim 4, wherein a width of the metal lines of the second grid is substantially equal to a width of patterned metal features of the first grid forming signal connections of the first grid.

7. The integrated circuit of claim 4, wherein a width of the metal lines of the second grid is substantially equal to a design rule minimum width for metal features of the metallization stack.

8. The integrated circuit of claim 4, wherein the metal lines of the second grid include metal lines extending in first and second orthogonal directions within the metallization stack.

9. The integrated circuit of claim 8, wherein adjacent metal layers of the metallization stack include metal lines extending in either the first or the second orthogonal direction, respectively.

10. The integrated circuit of claim 1, comprising a plurality of metal filled vias for interconnecting patterned metal features of the second grid located in different metal layers of the metallization stack.

11. The integrated circuit of claim 1, wherein a layout of the patterned metal features of the second grid is irregular.

12. A secure element comprising the integrated circuit of claim 1.

13. A mobile communications device comprising the secure element of claim 12.

14. A method of making an integrated circuit, the method comprising:
providing a semiconductor substrate; and
forming a metallization stack located on a major surface of the semiconductor substrate, the metallization stack comprising a plurality of metal layers including patterned metal features, wherein each metal layer of the metallization stack is separated by an intervening dielectric layer,
wherein forming the metallization stack comprises:
forming a first grid including patterned metal features for supplying power and providing signal connections to components of the integrated circuit located in the semiconductor substrate; and
forming a second grid for securing the integrated circuit against electromagnetic attacks, wherein the second grid includes patterned metal features interspersed with the patterned metal features of the first grid in at least some of the metal layers of the metallization stack, and wherein the patterned metal features of the second grid are electrically connected to the first grid.

15. The method of claim 14 comprising:
designing a layout of the first grid for supplying power and signal connections to components of the integrated circuit located in the semiconductor substrate;
designing a layout of the second grid by identifying areas in the metallization stack not occupied by the patterned metal features of the first grid and locating the patterned metal features of the second grid in said areas; and
forming the metallization stack according to the designed layouts of the first and second grids.

* * * * *